US008298938B2

(12) United States Patent
Quick et al.

(10) Patent No.: US 8,298,938 B2
(45) Date of Patent: Oct. 30, 2012

(54) PHASE CHANGE MEMORY CELL STRUCTURES AND METHODS

(75) Inventors: Timothy A. Quick, Boise, ID (US); Eugene P. Marsh, Boise, ID (US); Joseph N. Greeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/342,172

(22) Filed: Jan. 2, 2012

(65) Prior Publication Data
US 2012/0097911 A1    Apr. 26, 2012

Related U.S. Application Data

(63) Continuation of application No. 12/787,070, filed on May 25, 2010, now Pat. No. 8,097,537.

(51) Int. Cl.
*H01L 21/44* (2006.01)
(52) U.S. Cl. ...................................................... 438/652
(58) Field of Classification Search .................. 438/652
See application file for complete search history.

(56) References Cited

U.S. PATENT DOCUMENTS

| | | | |
|---|---|---|---|
| 7,642,123 B2 | 1/2010 | Lung | |
| 2006/0113520 A1 | 6/2006 | Yamamoto et al. | |
| 2006/0175596 A1 | 8/2006 | Happ et al. | |
| 2007/0215987 A1 | 9/2007 | Schwerin | |
| 2007/0246766 A1* | 10/2007 | Liu | 257/314 |
| 2008/0230762 A1 | 9/2008 | Park et al. | |
| 2009/0032796 A1 | 2/2009 | Lung | |
| 2009/0057642 A1 | 3/2009 | Sargent et al. | |
| 2009/0095951 A1 | 4/2009 | Kostylev et al. | |
| 2009/0194758 A1 | 8/2009 | Chen | |
| 2010/0065804 A1* | 3/2010 | Park | 257/4 |
| 2010/0276654 A1* | 11/2010 | Chen et al. | 257/2 |

OTHER PUBLICATIONS

Pirovano, et al., Reliability Study of Phase-Change Nonvolatile Memories', IEEE Transactions on Device and Materials Reliability, vol. 4, No. 4/5, pp. 422-427 (Sep. 2004).
Raoux, et al., "Phase-change random access memory: A scalable technology", IBM J. Res & Dev, vol. 52., No. 4/5, pp. 465-479, (Jul./Sep. 2008).

* cited by examiner

*Primary Examiner* — Charles Garber
*Assistant Examiner* — Andre' C Stevenson
(74) *Attorney, Agent, or Firm* — Brooks, Cameron & Huebsch, PLLC

(57) ABSTRACT

Phase change memory cell structures and methods are described herein. A number of methods of forming a phase change memory cell structure include forming a dielectric stack structure on a first electrode, wherein forming the dielectric stack structure includes creating a second region between a first region and a third region of the dielectric stack structure, the second region having a thermal conductivity different than a thermal conductivity of the first region and different than a thermal conductivity of the third region of the dielectric stack. One or more embodiments include forming a via through the first, second, and third regions of the dielectric stack structure, depositing a phase change material in the via, and forming a second electrode on the phase change material.

29 Claims, 7 Drawing Sheets

PHASE CHANGE MEMORY CELL STRUCTURES AND METHODS

CROSS-REFERENCE TO RELATED APPLICATION

This application is a Continuation of U.S. application Ser. No. 12/787,070, filed May 25, 2010, the specification of which is incorporated herein by reference.

TECHNICAL FIELD

The present disclosure relates generally to semiconductor memory devices, methods, and systems, and more particularly, to phase change memory cell structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, such as phase change random access memory (PCRAM) and resistive random access memory (RRAM), among others.

A physical layout of a PCRAM memory device may resemble that of a DRAM device, with the capacitor of the DRAM cell being replaced by a phase change material, such as Germanium-Antimony-Telluride (GST), which may be coupled to an access device, such as a diode, a field effect transistor (FET), or a bipolar junction transistor (BJT), for example.

The phase change material of a PCRAM device may exist in an amorphous, higher resistance state, or a crystalline, lower resistance state. The resistance state of the PCRAM cell may be altered by applying sources of energy to the cell, such as current pulses or pulses of light, among other sources of energy. For example, the resistance state of the PCRAM cell may be altered by heating the cell with a programming current. This results in the PCRAM cell being programmed to a particular resistance state, which may correspond to a data state.

In a binary system, for example, the amorphous, higher resistance state may correspond to a data state of 1, and the crystalline, lower resistance state may correspond to a data state of 0. However, the choice of these corresponding data states may be reversed, that is, in other binary systems, the amorphous, higher resistance state may correspond to a data state of 0, and the crystalline, lower resistance state may correspond to a data state of 1. PCRAM devices may also be configured to provide multi-level storage. That is, the memory device may have a plurality of discrete and identifiable states which allow for multi-bit storage in a single memory cell.

Various failure and degradation mechanisms of PCRAM cells are associated with the interface between the phase change material and surrounding materials (e.g., between the phase change material and electrodes and/or interconnects). For example, heat loss due to heat transfer to adjacent cells and/or adjacent materials can result in increased reset currents. PCRAM cells can also experience degradation over time due to atomic migration between the phase change material and electrode material, which can result in poor cycling endurance, for instance.

As such, some previous PCRAM architectures include attempts to control the geometry or physical dimensions of PCRAM cells in order to isolate the active region away from the electrode interfaces. Examples of such previous architectures include various PCRAM bridge cell structures and confined cell structures. However, such previous architectures can have various drawbacks such as limited scalability and/or complicated fabrication processes and may not provide sufficient thermal properties (e.g., heat loss characteristics) associated with operation of the PCRAM cells.

DETAILED DESCRIPTION

Phase change memory cell structures and methods are described herein. A number of methods of forming a phase change memory cell structure include forming a dielectric stack structure on a first electrode, wherein forming the dielectric stack structure includes creating a second region between a first region and a third region of the dielectric stack structure, the second region having a thermal conductivity different than a thermal conductivity of the first region and different than a thermal conductivity of the third region of the dielectric stack. One or more embodiments include forming a via through the first, second, and third regions of the dielectric stack structure, depositing a phase change material in the via, and forming a second electrode on the phase change material.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

Figure 1:
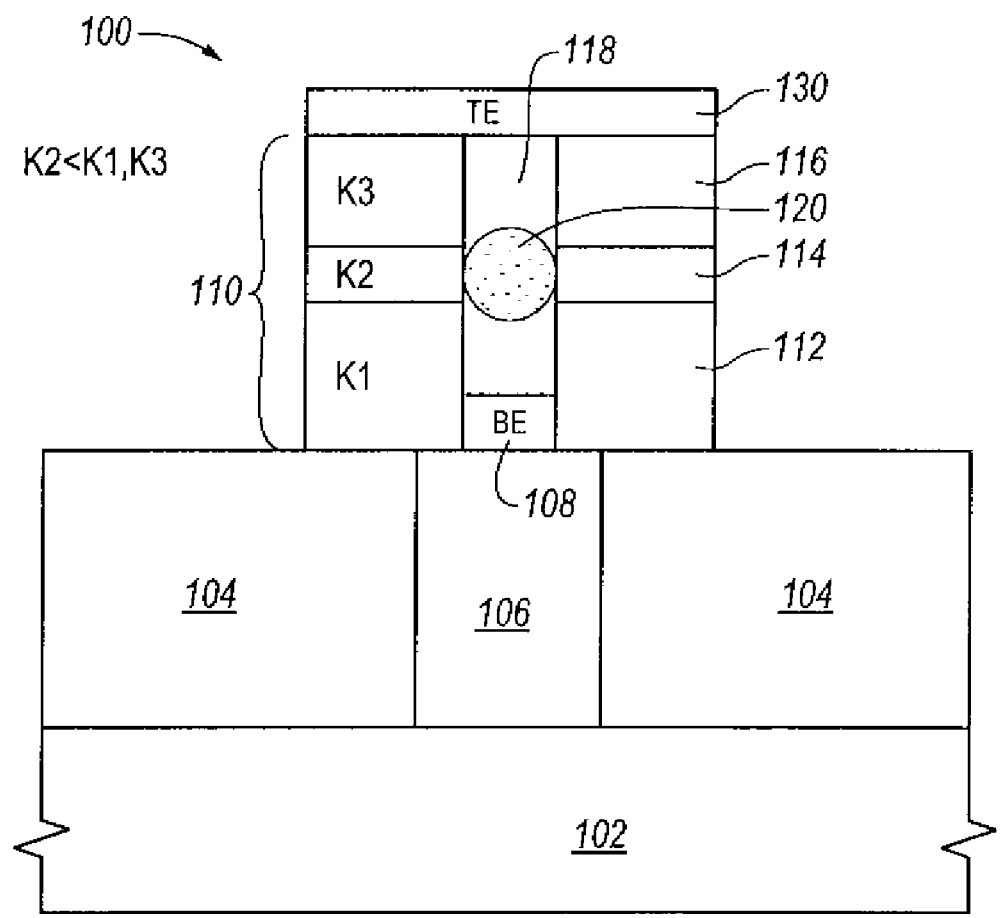
FIG. 1 illustrates a phase change memory cell structure in accordance with embodiments of the present disclosure.

FIG. 1 illustrates a phase change memory cell structure 100 in accordance with embodiments of the present disclosure. The phase change structure 100 is formed on a base semiconductor structure that includes a substrate 102 including a conductive contact 106 formed in a dielectric material 104. The substrate 102 can be a silicon substrate, silicon on insulator (SOI) substrate, or silicon on sapphire (SOS) substrate, among others. The dielectric material 104 can be a dielectric oxide such as silicon dioxide ($SiO_2$), among others. The conductive contact 106 can be made of tungsten (W) or other suitable material and can be formed in the dielectric material 104 via a masking and etching process, for instance.

The phase change structure 100 includes a first electrode 108. The first electrode 108 can be a bottom electrode (BE) 108 and can be made of various conductive materials or composite structures including TiN (titanium nitride), TaN (tantalum nitride), copper, and/or tungsten, for example. The bottom electrode 108 is formed on conductive contact 106.

The phase change structure 100 includes a dielectric stack structure 110 formed over the bottom electrode 108. In various embodiments, the dielectric stack (e.g., 110) includes a number of stacked regions each having a particular thermal conductivity (K). In FIG. 1, stack 110 includes a first region comprising a first dielectric material 112 having a thermal conductivity K1, a second region comprising a second dielectric material 114 having a thermal conductivity K2, and a third region comprising a third dielectric material 116 having a thermal conductivity K3. In FIG. 1, the thermal conductivity K2 is less than the thermal conductivity K1 and K3. That is, the second region (e.g., material 114) has a lower thermal conductivity than the first region (e.g., material 112) and the third region (e.g., material 116). The dielectric material 112 can be the same as the dielectric material 116 (e.g., such that K1 is equal K3), in one or more embodiments. However, in one or more embodiments, the dielectric material 112 is different than the dielectric material 116 (e.g., such that K1 is different than K3).

As described further below in connection with FIGS. 3A-3C, in one or more embodiments, a bulk first material (e.g., 112) can be altered, resulting in an altered region (e.g., a second region of the dielectric stack) having a thermal conductivity (e.g., K2) different (e.g., less) than the thermal conductivity (e.g., K1) of the bulk first material. For instance, an upper region of a bulk first dielectric material (e.g., 112) that includes the first region may be altered (e.g., via oxidation and/or ion implantation) resulting in an altered region (e.g., a second region) having a thermal conductivity (e.g., K2) different (e.g., less) than the thermal conductivity (e.g., K1) of the bulk first material (e.g., 112). As such, the number of stacked regions can be located in the same dielectric material, in some embodiments.

The phase change memory structure 100 includes a phase change material 118 formed in a via (e.g., via 225 shown in FIG. 2D) through the dielectric stack 110. The structure 100 also includes a second electrode 130. The second electrode can be a top electrode (TE) 130 and is formed on the phase change material 118.

As illustrated in FIG. 1, the phase change material 118 in the via is in contact with each of the first, second, and third regions (e.g., first dielectric material 112, second dielectric material 114, and third dielectric material 116, respectively). That is, the side surfaces of phase change material 118 are in contact with first dielectric material 112, second dielectric material 114, and third dielectric material 116.

FIG. 1 illustrates an active region 120 located within the bulk phase change material 118. The active region 120 represents the portion of the phase change material 118 that actively undergoes phase transitions (e.g., amorphous to crystalline or vice versa) during PCRAM cell operation (e.g., SET or RESET operations as are known and understood in the art). In various embodiments, the dielectric stack 110 is configured so as to draw heat away from the interface between the phase change material 118 and the bottom electrode 108 and/or top electrode 130. That is, the dielectric stack 110 is configured such that the active region 120 of the phase change material 118 is located a particular distance from the bottom electrode 108 and the top electrode 130. As such, the active region 120 is not in contact with the interface of the phase change material 118 and electrodes 108 and 130.

As indicated above, in various embodiments, the dielectric stack 110 can be constructed such that the thermal conductivity (e.g., K2) of the second region is less than the thermal conductivity (e.g., K1) of the first region and is also less than the thermal conductivity (e.g., K3) of the third region. As one example, the thermal conductivity K2 of the middle region can be about 0.03 W/mK (Watts/meter Kelvin) or less, while the thermal conductivity K1 of the lower region and the thermal conductivity K3 of the upper region can be about 40 W/mK. For instance, the material 114 can be a material such as a silica aerogel, while the materials 112 and/or 116 can be a material such as silicon nitride (e.g., a dielectric material having a relatively high thermal conductivity compared to the material 114 of the middle region of the dielectric stack 110). In one or more embodiments, the thermal conductivity K2 of the second material 114 is at least one hundred times less than the thermal conductivity K1, K3 of the first and third material 112 and 116, respectively. Although, embodiments are not so limited. For instance, in one or more embodiments, the thermal conductivity K2 is approximately two times less than K1 and K3. In one or more embodiments, K2 is approximately ten times less than K1 and K3.

Configuring the phase change structure 100 such as shown in FIG. 1 can have various benefits. For instance, providing a phase change material 118 within a via through a dielectric stack 110 that includes a middle region having a relatively low thermal conductivity positioned between a lower region and an upper region having a higher thermal conductivity can maintain heat generated within a PCRAM cell at an isolated region (e.g., active region 120) away from the electrode interfaces. Providing a phase change structure 100 having an active region 120 located away from the electrode interfaces can provide improved cycling performance as compared to previous phase change memory cell structures by reducing failure mechanisms caused by atomic migration, for instance.

Figure 2A:
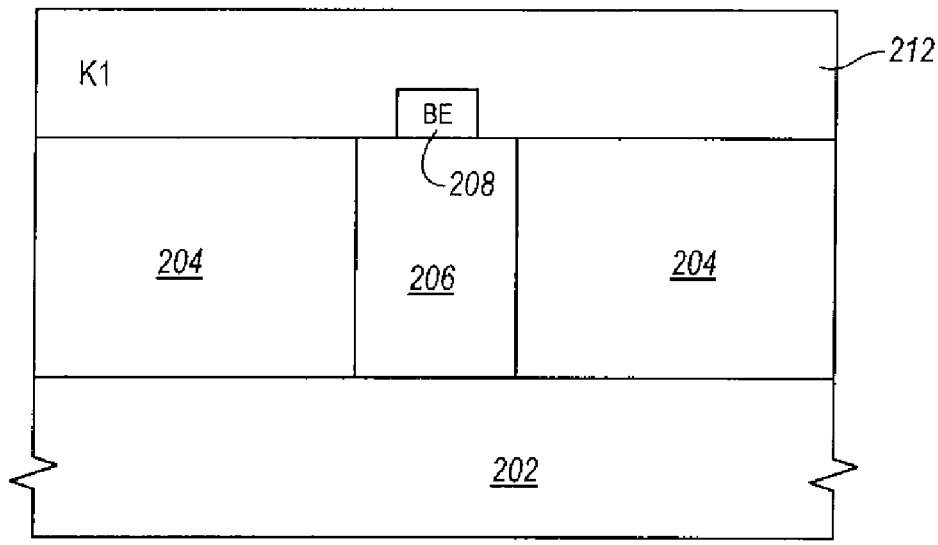
FIGS. 2A-2F illustrate process steps associated with forming a phase change memory cell structure in accordance with embodiments of the present disclosure.

FIGS. 2A-2F illustrate process steps associated with forming a phase change memory cell structure (e.g., structure 100 shown in FIG. 1) in accordance with embodiments of the present disclosure. FIG. 2A includes a substrate 202 including a conductive contact 206 formed in a dielectric material 204. The substrate 202 can be a silicon substrate, silicon on insulator (SOI) substrate, or silicon on sapphire (SOS) substrate, among others. The dielectric material 204 can be a dielectric oxide such as silicon dioxide ($SiO_2$), among others. The conductive contact 206 can be made of tungsten (W) or other suitable material and can be formed in the dielectric layer 204 via a masking and etching process, for instance.

A bottom electrode (BE) 208 is formed on conductive contact 204. The bottom electrode 208 can be made of various conductive materials or composite structures including TiN (titanium nitride), TaN (tantalum nitride), copper, and/or tungsten, for example. A first dielectric material 212 having a thermal conductivity K1 is formed over the bottom electrode 208. The material 212 can be deposited to a height of about 50 nm over the upper surface of bottom electrode 208, for example, and the upper surface of the material 212 may be planarized (e.g., via chemical mechanical polishing). The material 212 can be, for example, a material such as silicon nitride having a thermal conductivity of about 30-40 W/mK. Although, embodiments are not limited to a particular type of material 212 or to a particular thermal conductivity K1.

Figure 2B:
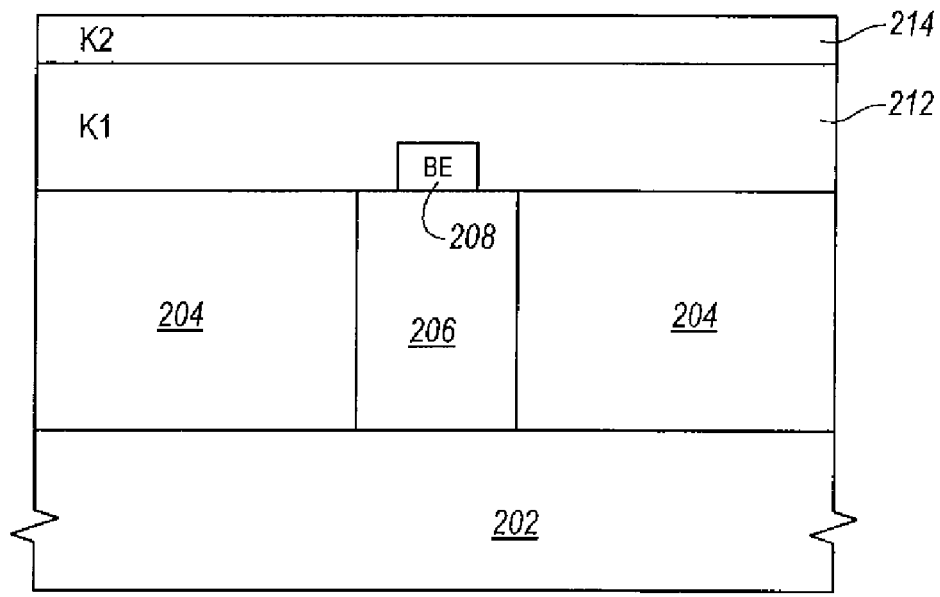

FIG. 2B illustrates a second dielectric material 214 having a thermal conductivity K2 formed on the first dielectric material 212. The material 214 can have a thickness of about 25 nm, for example. In various embodiments, the thermal conductivity K2 of the material 214 is less than the thermal conductivity K1 of the material 212. The material 214 can be a material such as silicon dioxide, aluminum oxide, or a silica aerogel material, for example, and can have a thermal conductivity K2 below 4.0 W/mK. However, embodiments are not limited to a particular type of material 214 or to a particular thermal conductivity K2.

Figure 2C:
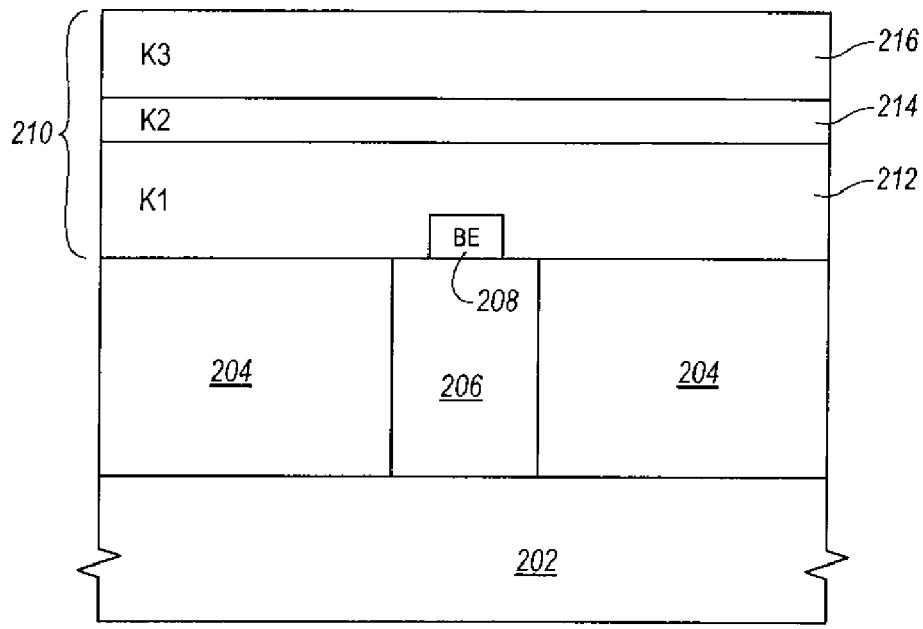

FIG. 2C illustrates a third dielectric material 216 having a thermal conductivity K3 formed on the second dielectric material 214. The material 216 can have a thickness of about 25 nm, for example. In various embodiments, the thermal conductivity K3 of the material 216 is greater than the thermal conductivity K2 of the second material 214. The material 216 can be a material such as silicon nitride, for example, and can have a thermal conductivity K3 of about 30-40 W/mK. In one or more embodiments, the material 216 can be the same as the material 212. However, embodiments are not limited to a particular type of material 216 or to a particular thermal conductivity K3.

The materials 212, 214, and 216 form a dielectric stack 210. The materials 212, 214, and 216 of stack 210 can be formed, e.g., deposited, via various methods such as chemical vapor deposition (CVD) and atomic layer deposition (ALD), among other methods, as will be appreciated by one of ordinary skill in the art.

Figure 2D:
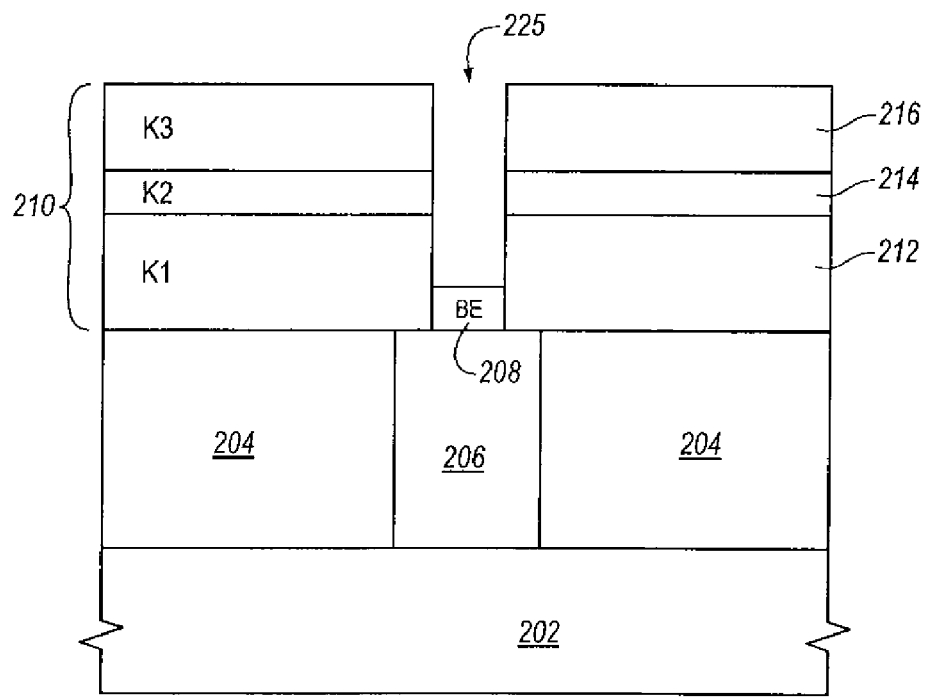

FIG. 2D illustrates a via 225 formed in the dielectric stack 210. The via 225 if formed through the first dielectric material 212, the second dielectric material 214, and the third dielectric material 216 to the bottom electrode 208. The via 225 can be etched in dielectric stack 210 and may be referred to as a contact hole.

Figure 2E:
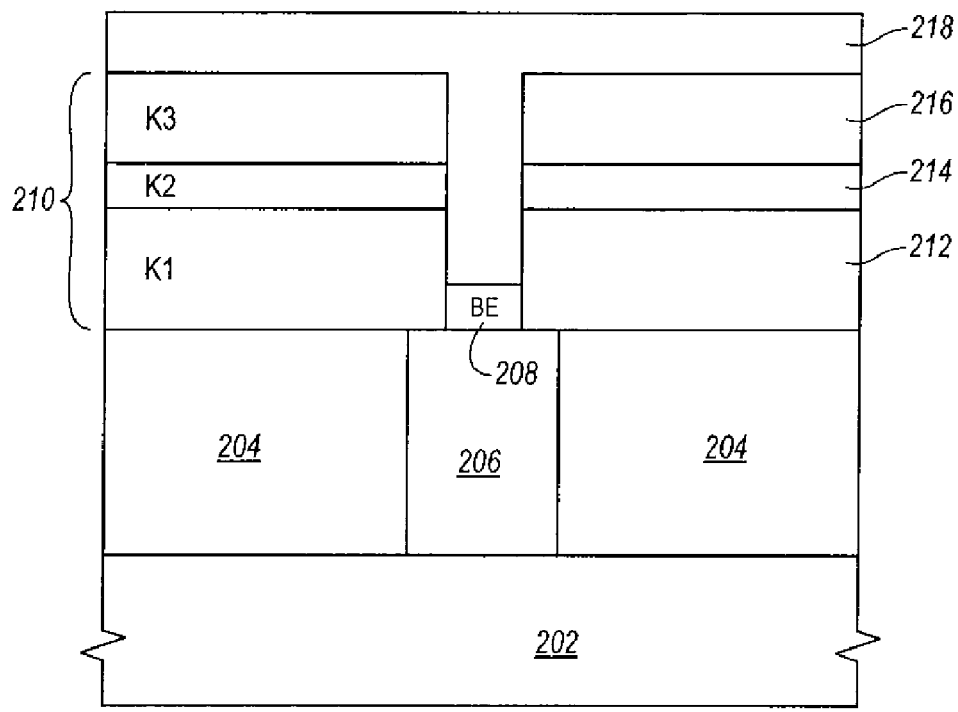

FIG. 2E illustrates a phase change material 218 deposited in via 225 and on an upper surface of the third dielectric material 216. The phase change material 218 can be deposited via various processes such as ALD (atomic layer deposition, CVD (chemical vapor deposition), and/or PVD (physical vapor deposition), among other suitable deposition processes. The phase change material 218 can be a phase change chalcogenide alloy such as a Germanium-Antimony-Tellurium (GST) material (e.g., a Ge—Sb—Te material such as $Ge_2Sb_2Te_5$, $Ge_1Sb_2Te_4$, $Ge_1Sb_4Te_7$, etc.). The hyphenated chemical composition notation, as used herein, indicates the elements included in a particular mixture or compound, and is intended to represent all stoichiometries involving the indicated elements. Other phase change materials can include alloys of: Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

In one or more embodiments, a top electrode can be formed, (e.g., deposited) on the phase change material 218. In such embodiments, the portion of phase change material 218 above the via 225 can act as a thermal barrier, which can result in the active region of the memory cell being located away from the interface of the phase change material 218 and the electrodes 208, 230.

However, the phase change material 218 shown in FIG. 2E can be further processed (e.g., via CMP) to remove portions of the phase change material 218 (e.g., portions of the phase change material 218 that are not located within the via 225) prior to formation of the top electrode thereon. For instance, FIG. 2F illustrates a top electrode (TE) 230 deposited on an upper surface of the material 216 and an upper surface of the phase change material 218 after the phase change material 218 outside of the via 225 has been removed.

Figure 2F:
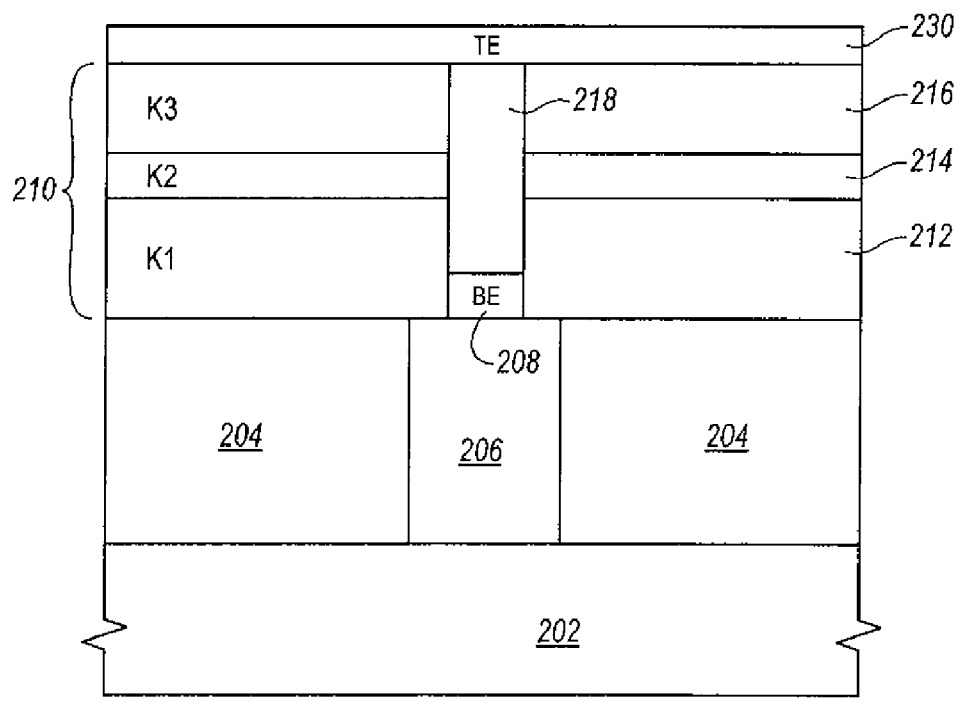

Forming a phase change memory structure such as that illustrated in FIG. 2F can result in an active region (e.g., active region 120 shown in FIG. 1) that is located away from the interface of the phase change material 218 and electrodes 208, 230. For instance, the active region within the phase change material 218 can be located at a height within phase change material 218 that corresponds to the location of the second dielectric material 214. The location of the active region can be due, at least in part, to the thermal conductivity characteristics (K1, K2, and K3) of the materials within dielectric stack 210. For instance, the relatively low thermal conductivity K2 of the second material 214 as compared to the thermal conductivity K1, K3 of the first and third materials 212, 216 can result in heat within the phase change material 218 being isolated at a region adjacent to the second dielectric material 214. As one of ordinary skill in the art will appreciate, the structure shown in FIG. 2F can subjected to further processing (e.g., further masking and etching) to produce a phase change memory cell structures such as structure 100 shown in FIG. 1 or structures 500-1 and 500-2 shown in FIG. 5.

Figure 3A:
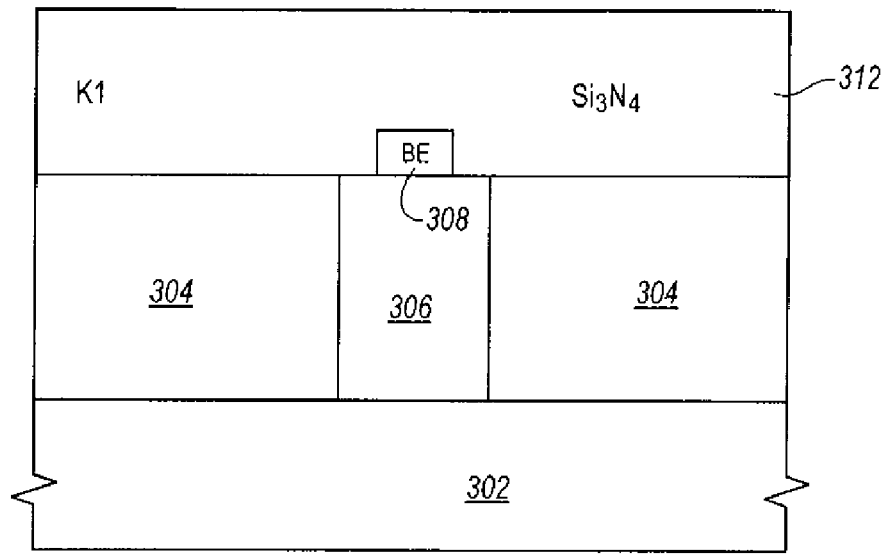
FIGS. 3A-3C illustrate process steps associated with forming a phase change memory cell structure in accordance with embodiments of the present disclosure.
Figure 3B:
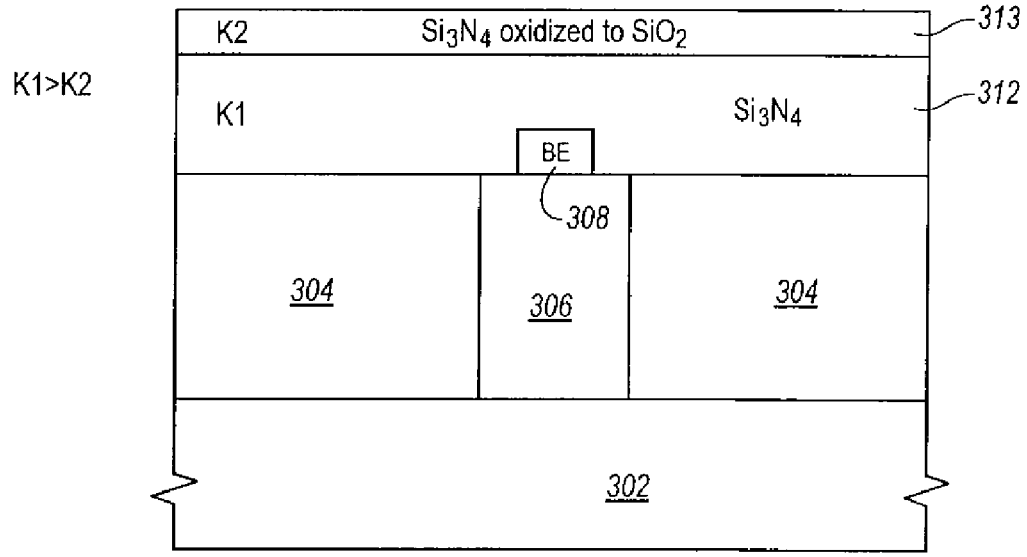
Figure 3C:
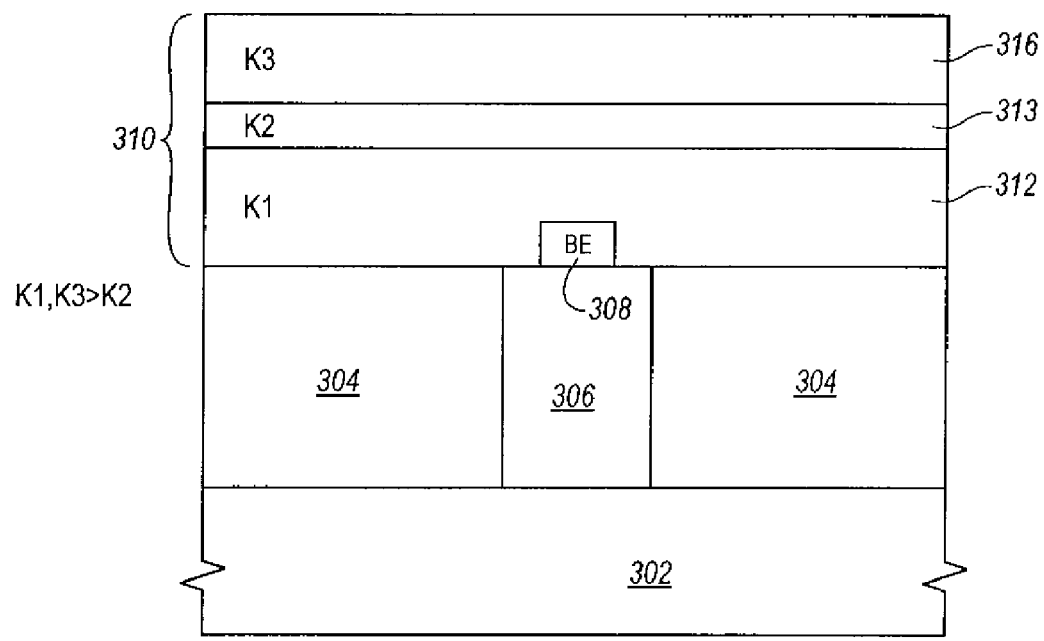

FIGS. 3A-3C illustrate process steps associated with forming a phase change memory cell structure in accordance with embodiments of the present disclosure. Similar to FIGS. 1 and 2A, FIG. 3A includes a substrate 302 including a conductive contact 306 formed in a dielectric material 304. A bottom electrode (BE) 308 is formed on conductive contact 304.

A first dielectric material 312 having a thermal conductivity K1 is formed over the bottom electrode 308. In the embodiment illustrated in FIG. 3A, the dielectric material 312 is silicon nitride ($S_3N_4$) having a thermal conductivity K1 of about 30-40 W/mK; however, embodiments are not so limited. The material 312 can be deposited to a height of about 75 nm over the upper surface of bottom electrode 308, for example, and the upper surface of the material 312 may be planarized (e.g., via chemical mechanical polishing).

FIG. 3B illustrates an altered region 313 of the first dielectric material 312. In various embodiments, the altered region 313 is formed such that it has a thermal conductivity K2, which is different (e.g., less) than the thermal conductivity K1 of the bulk first material 312. The altered region 313 can be created by performing an oxidation process on an upper surface of the bulk first material 312. As such, the altered region 313 is an oxidized region 313 of the first material 312. In this example, the upper surface of the silicon nitride material 312 is oxidized to silicon dioxide (e.g., via a rapid thermal oxidation process), which can have a thermal conductivity of about 0.95 W/mK. In one or more embodiments, the altered region 313 can have a thickness of about 25 nm, for example.

In one or more embodiments, the altered region 313 can be created by performing an ion implantation process on the bulk material 312. For instance, an oxygen implant step can be performed on a bulk silicon nitride material 312 in order to lower the thermal conductivity of the silicon nitride at a predetermined region 313 above the bottom electrode 308. In such embodiments, the altered region 313 (e.g., the ion implanted second region) is located between a first region within material 312 and a third region within material 312. That is, performing the ion implantation can create a dielectric stack 310 configured so as to include three separate regions having particular thermal conductivities (e.g., a first region located in material 312 and having a thermal conductivity K1, a second region 313 located above the first region within material 312 and having a thermal conductivity K2, and a third region located in material 312 and having a thermal conductivity K1). Embodiments are not limited to a particular type of ion implantation. The particular type of ion implantation can depend on various factors such as the type of bulk material 412 and/or a desired thermal conductivity for the altered region 317, among other factors.

FIG. 3C illustrates a third dielectric material 316 having a thermal conductivity K3 formed on the altered region 313 of first dielectric material 312. The altered region 313 is located between the first dielectric material 312 and the third dielectric material 316 and may be referred to as a second region 313. The material 316 can have a thickness of about 25 nm, for example. In various embodiments, the thermal conductivity K3 of the material 316 is greater than the thermal conductivity K2 of the second region 314. The material 316 can be the same as the material 312 (e.g., silicon nitride in this example). However, embodiments are not limited to a particular type of material 316 or to a particular thermal conductivity K3.

The dielectric stack 310 is configured so as to include three separate regions having particular thermal conductivities (e.g., a first region located in material 312 and having a thermal conductivity K1, a second region 313 located above the first region within material 312 and having a thermal conductivity K2, and a third region located in material 316 and having a thermal conductivity K3). The structure shown in FIG. 3C can undergo further processing (e.g., as described above in connection with FIGS. 2D-2F). Additionally, in embodiments in which an ion implantation process is performed to create altered region 313, an optional thermal anneal step may be provided (e.g., to activate the implanted dopants and/or to heal the stack 310 of possible implant induced damage).

Figure 4:
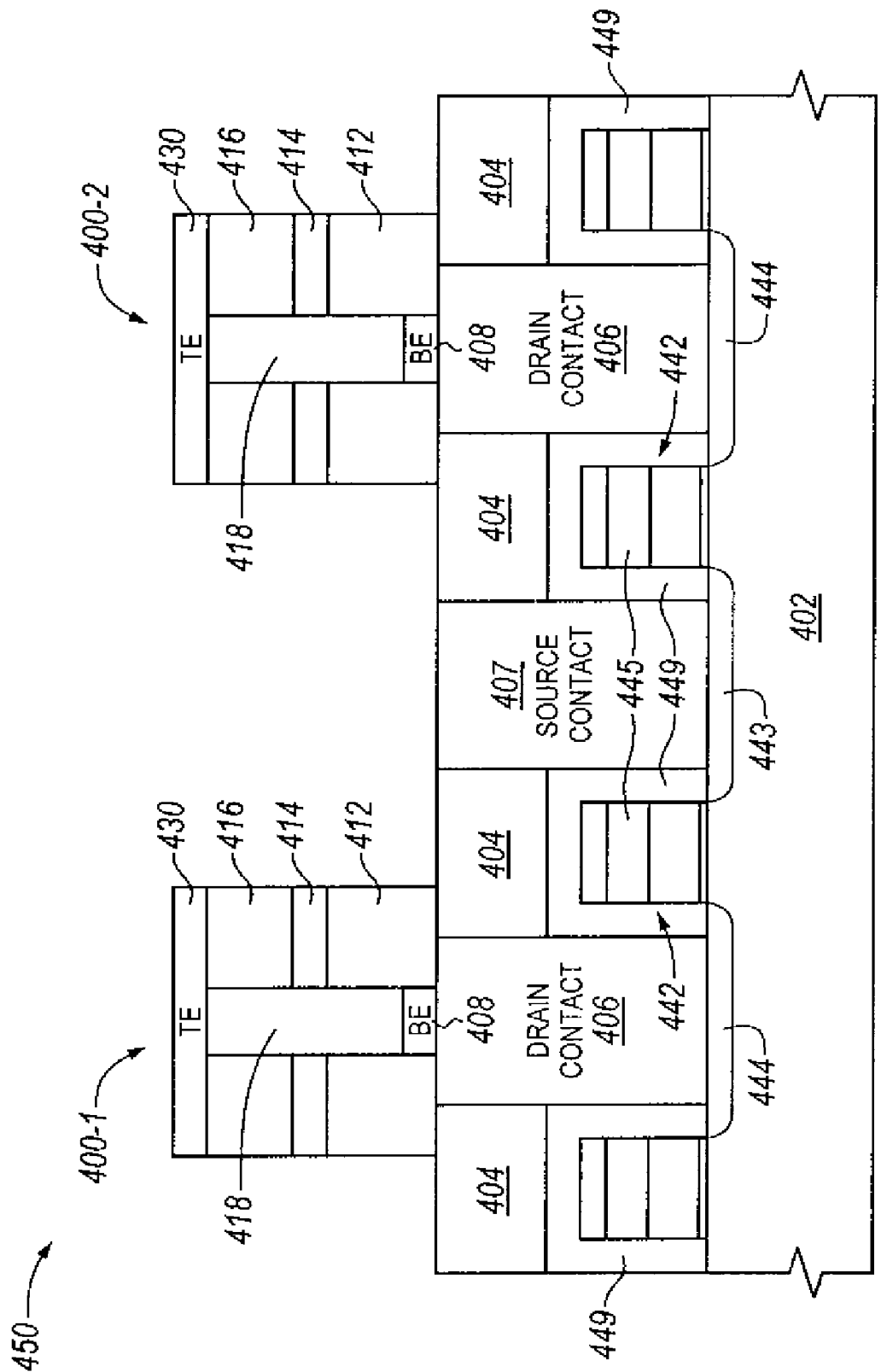
FIG. 4 illustrates a schematic cross-sectional view of a portion of a phase change memory device having phase change memory cell structures coupled to access devices in accordance with embodiments of the present disclosure.

FIG. 4 illustrates a schematic cross-sectional view of a portion of a phase change memory device 450 having phase change memory cell structures 400-1 and 400-2 coupled to access devices 442 in accordance with embodiments of the present disclosure. FIG. 4 illustrates a number of access devices 442 formed on a substrate 402. The access devices 442 can be MOSFET (metal oxide semiconductor field effect transistor) devices having associated source 443, drain 444, and gate 445 regions. However, embodiments are not limited to a particular type of access device. For instance, the access devices 442 can be diodes or BJTs, among other types of access devices for operating phase change memory cells. As an example, the substrate 402 can be a p-type semiconductor substrate with n-type source 443 and drain 444 regions.

The phase change memory device 450 includes a source contact 407 and drain contacts 406. The source and drain contacts are connected to the respective source 443 and drain 444 regions of the device 450 and can be metal contacts. A material 449 is formed around the gate stacks of the transistors 442 to electrically insulate the transistors 442 from the contacts 406 and 407. As such, the material 449 can be a dielectric material such as silicon nitride, among various other dielectric materials.

The device 450 includes a dielectric material 404 formed over the transistors 442 and located between the source 407 and drain 406 contacts. The material 404 can be a dielectric material such as silicon dioxide or other suitable dielectric material. The phase change structures 400-1 and 400-2 include a bottom electrode (BE) 408 formed on a respective drain contact 406. The structures 400-1 and 400-2 can be formed in accordance with embodiments described herein above.

For instance, as illustrated in FIG. 4, the structures 400-1 and 400-2 include a phase change material 418 located in a via formed through a dielectric stack comprising a first region 412, a second region 414, and a third region 416. As described above, the regions 412, 414, and 416 can each be different dielectric materials having different thermal conductivities.

In various embodiments, the thermal conductivity of the second region 414 (e.g., the middle region) is less than the thermal conductivity of the first region 412 and/or third region 416.

The sidewalls of the phase change material 418 are in contact with each of the first, second, and third regions (412, 414, and 416, respectively) within the via. The structures 400-1 and 400-2 include a top electrode (TE) 430 formed over the phase change material 418. The structures 400-1 and 400-2 are configured such that the active region of the phase change material 418 is located away from the interface between the phase change material 418 and the electrodes 408 and 430.

Phase change memory cell structures and methods are described herein. A number of methods of forming a phase change memory cell structure include forming a dielectric stack structure on a first electrode, wherein forming the dielectric stack structure includes creating a second region between a first region and a third region of the dielectric stack structure, the second region having a thermal conductivity different than a thermal conductivity of the first region and different than a thermal conductivity of the third region of the dielectric stack. One or more methods include forming a via through the first, second, and third regions of the dielectric stack structure, depositing a phase change material in the via, and forming a second electrode on the phase change material.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a memory cell structure, comprising forming a dielectric stack structure on a first electrode, wherein forming the dielectric stack structure includes creating a second region between a first region and a third region of the dielectric stack structure, the second region having a thermal conductivity different than a thermal conductivity of the first region and different than a thermal conductivity of the third region of the dielectric stack; forming a via through the first, second, and third region of the dielectric stack structure; and depositing a resistance variable material in the via such that the resistance variable material within the via is in contact with the first region, the second region and the third region.

2. The method of claim 1, including forming a second electrode on the resistance variable material.

3. The method of claim 1, including forming the dielectric stack structure such that the deposited resistance variable material within the via is in contact with the first region, the second region, and the third region.

4. The method of claim 1, wherein forming the dielectric stack structure includes:
depositing a first material on the first electrode to form the first region;
depositing a second material on the first material to create the second region; and
depositing a third material on the second material to create the third region.

5. The method of claim 4, wherein the first material is the same as the third material.

6. The method of claim 1, wherein forming the dielectric stack structure includes:
depositing a first material on the first electrode to form the first region; and
performing an oxidation process on an upper surface of the first material such that the second region is an oxidized region.

7. The method of claim 6, wherein performing the oxidation process includes performing an ion implantation process on the first material to form the second region.

8. The method of claim 1, wherein forming the via through the dielectric stack includes forming the via through the first region, the second region, and the third region to the first electrode.

9. The method of claim 1, including forming the dielectric stack structure such that the thermal conductivity of the first and third regions is greater than the thermal conductivity of the second region.

10. The method of claim 1, including forming the dielectric stack structure such that thermal conductivity of the first region is different than the thermal conductivity of the third region.

11. A method of forming a memory cell structure, comprising:
forming a first electrode;
forming a first dielectric material on the first electrode;
forming an altered region in the first dielectric material, the altered region having a different thermal conductivity than a thermal conductivity of the first dielectric material;
forming a via through the first dielectric material and through the altered region to the first electrode;
forming a resistance variable material in the via, wherein the altered region is formed at a depth corresponding to a desired location of an active region of the resistance variable material; and
forming a second electrode on the resistance variable material.

12. The method of claim 11, wherein forming the altered region includes performing an oxidation process on an upper region of the first dielectric material such that the altered region is an oxidized region formed at a predetermined location above the first electrode.

13. The method of claim 11, wherein forming the altered region includes performing an ion implantation process on the first dielectric material such that the altered region within the first dielectric material is formed at a predetermined location above the first electrode.

14. The method of claim 11, wherein the method includes:
forming a second dielectric material on the first dielectric material prior to forming the via, the second dielectric material having a thermal conductivity that is greater than the thermal conductivity of the altered region; and
forming the via through the second dielectric material, the altered region, and the first dielectric material to the first electrode.

15. The method of claim 14, wherein the thermal conductivity of the altered region is less than the thermal conductivity of the first and second dielectric material.

16. The method of claim 11, including forming an oxide on an upper surface of the first electrode prior to forming the first dielectric material on the first electrode.

17. The method of claim 11, wherein forming the first dielectric material on the first electrode includes forming the first dielectric material on at least three surfaces of the first electrode.

18. The method of claim 10, wherein the resistance variable material comprises a phase change chalcogenide.

19. A memory cell structure, comprising:
a dielectric stack formed between a first electrode and a second electrode; and
a resistance variable material formed in a via through the dielectric stack; and
wherein the dielectric stack includes:
a first region having a first thermal conductivity;
a second region located above the first region and having a thermal conductivity less than the first thermal conductivity; and
a third region located above the second region and having a thermal conductivity greater than the second thermal conductivity.

20. The memory cell structure of claim 19, wherein the resistance variable material in the via is in contact with first region, the second region, and the third region.

21. The memory cell structure of claim 19, wherein the dielectric stack includes:
a first material formed on the first electrode and including the first region therein; and
a second material formed on the first material and including the second region therein; and
a third material formed on the second material and including the third region therein.

22. The memory cell structure of claim 19, wherein the resistance variable material comprises a chalcogenide alloy.

23. The memory cell structure of claim 19, wherein the dielectric stack includes a first material formed on the first electrode and including the first region therein, and wherein the second region is formed by oxidation of a portion of the first material.

24. The memory cell structure of claim 19, wherein the dielectric stack includes a first material formed on the first electrode and including the first region therein, and wherein the second region is an ion implanted region formed in the first material.

25. The memory cell structure of claim 24, wherein the first material formed on the first electrode includes the third region therein.

26. The memory cell structure of claim 19, wherein the dielectric stack is formed on the first electrode and the second electrode is formed on the resistance variable material.

27. A memory cell structure, comprising:
a material stack formed on a first electrode, the material stack including a first material formed on a first electrode, a second material formed on first material, and a third material formed on the second material;
a resistance variable material formed in a via through the material stack; and a second electrode formed on the resistance variable material;

wherein a thermal conductivity of the second material is less than a thermal conductivity of the first material and the third material.

28. The memory cell structure of claim 27, wherein the first, second, and third materials are dielectric materials.

29. The memory cell structure of claim 27, wherein the resistance variable material comprises a phase change material and wherein a side wall of the phase change material is in contact with the first material, the second material, and the third material within the via.

* * * * *